United States Patent [19]
Tanaka et al.

[11] Patent Number: 5,128,567
[45] Date of Patent: Jul. 7, 1992

[54] OUTPUT CIRCUIT OF SEMICONDUCTOR INTEGRATED CIRCUIT WITH REDUCED POWER SOURCE LINE NOISE

[75] Inventors: Fuminari Tanaka; Satoshi Nonaka, both of Tokyo, Japan

[73] Assignee: Kabushiki Kaisha Toshiba, Kawasaki, Japan

[21] Appl. No.: 345,259

[22] Filed: May 1, 1989

[30] Foreign Application Priority Data

May 2, 1988 [JP] Japan .................................. 63-109312

[51] Int. Cl.⁵ .................... H03K 17/687; H03K 5/13; H03K 19/094
[52] U.S. Cl. .................... 307/572; 307/576; 307/585; 307/602; 307/605; 307/451
[58] Field of Search ............... 307/605, 603, 602, 594, 307/595, 597, 451, 572, 576, 579, 585

[56] References Cited

U.S. PATENT DOCUMENTS

| | | | |
|---|---|---|---|
| 4,700,089 | 10/1987 | Fujii et al. | 307/605 |
| 4,719,369 | 1/1988 | Asano et al. | 307/263 |
| 4,725,747 | 2/1988 | Stein et al. | 307/579 |
| 4,774,690 | 9/1988 | Watanabe et al. | 365/181 |
| 4,789,793 | 12/1988 | Ehni et al. | 307/303 |
| 4,820,942 | 4/1989 | Chan | 307/542 |
| 4,890,016 | 12/1989 | Tanaka et al. | 307/605 |

FOREIGN PATENT DOCUMENTS

| | | |
|---|---|---|
| 0253914 | 1/1988 | European Pat. Off. . |
| 0292641 | 11/1988 | European Pat. Off. . |
| 2177865 | 1/1987 | United Kingdom . |

OTHER PUBLICATIONS

Anderson et al., "Investigation of the Performance of Advanced CMOS Output Buffers in a Transmission Line Environment", May 10–12, 1988, 8079 Electro 1988 Conference Record 13, pp. 1–4.

*Primary Examiner*—Stanley D. Miller
*Assistant Examiner*—Trong Phan
*Attorney, Agent, or Firm*—Finnegan, Henderson, Farabow, Garrett and Dunner

[57] ABSTRACT

An output circuit of a semiconductor integrated circuit includes a plurality of output transistors having different current driving abilities for a load, and a plurality of signal delay means for delaying signals for driving each of the output transistors by different delay times, wherein the current driving ability of that one of the plurality of output transistors which is driven by the delay signal of one of the signal delay means which has a first delay time is set to be larger than the current driving ability of that one of the plurality of output transistors which is driven by the delay signal of one of the signal delay means which has a second delay time shorter than the first delay time.

9 Claims, 10 Drawing Sheets

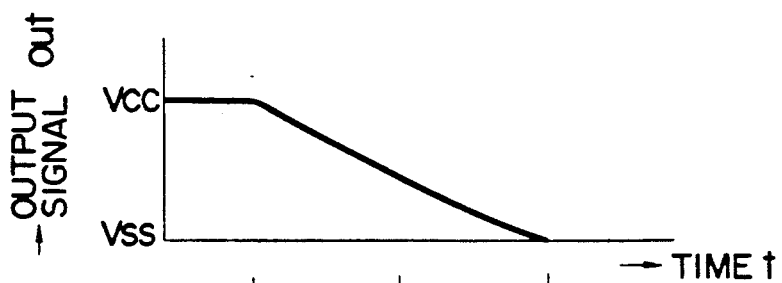
FIG.2A
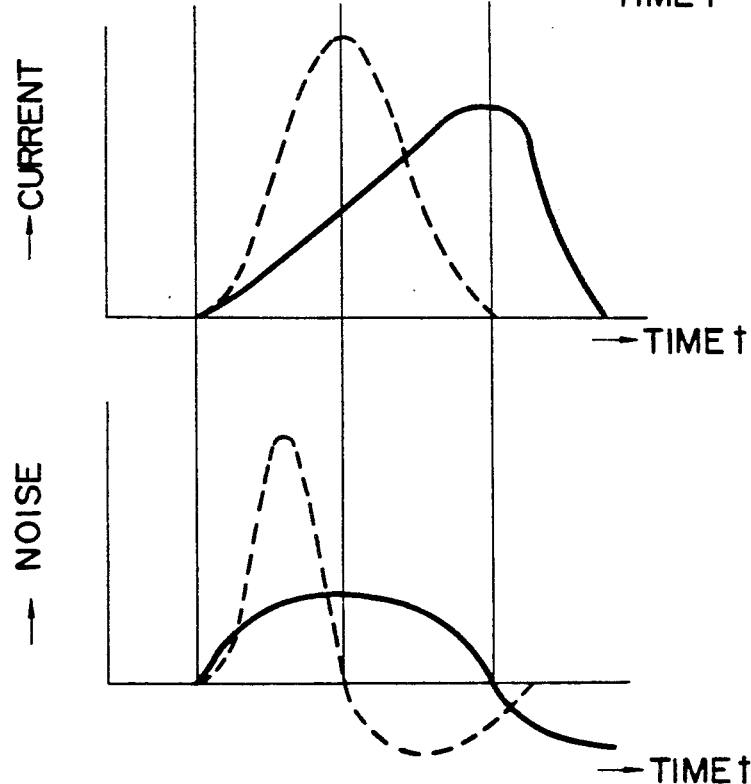
FIG.2B
FIG.2C
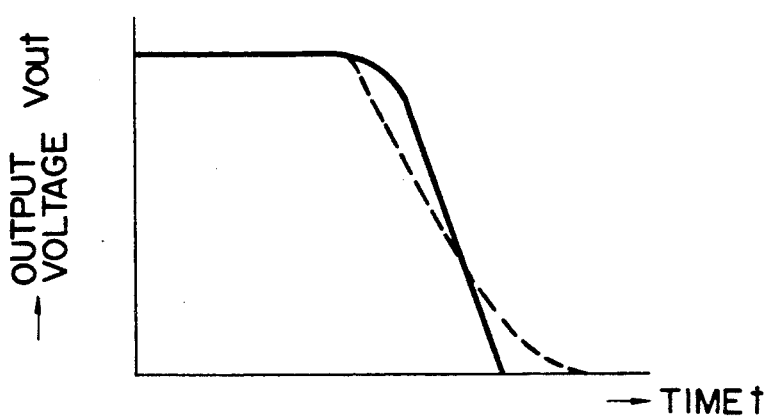
FIG. 3

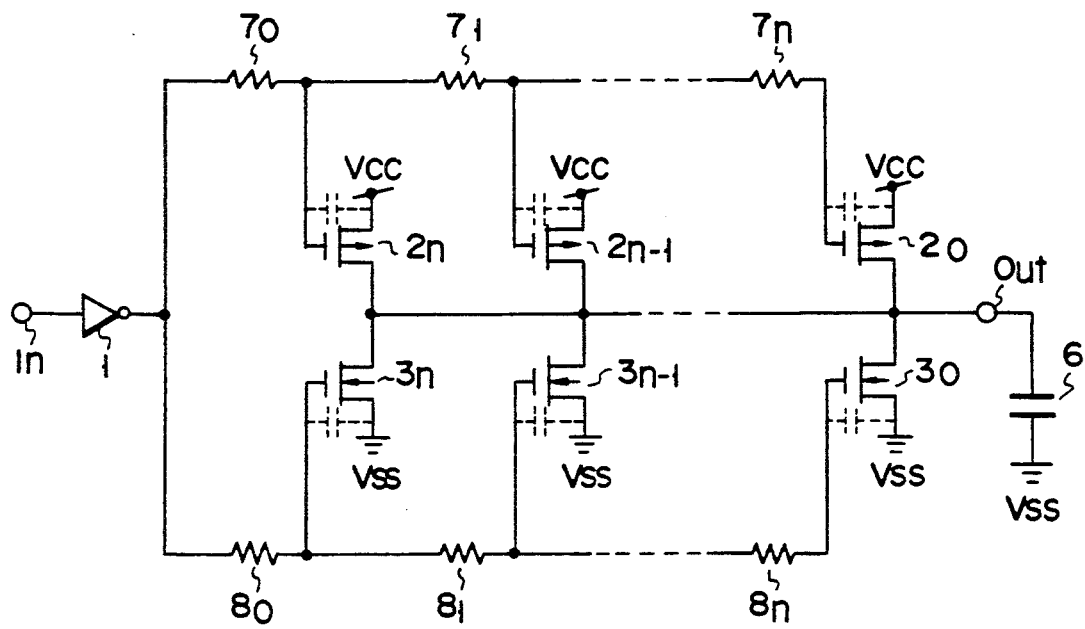
F I G. 4
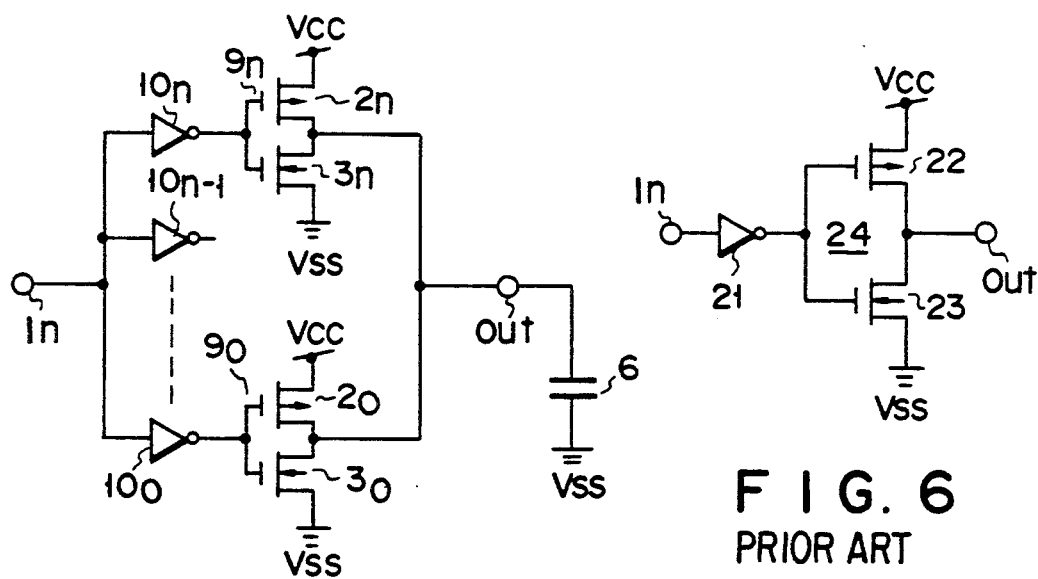
F I G. 5
F I G. 6
PRIOR ART

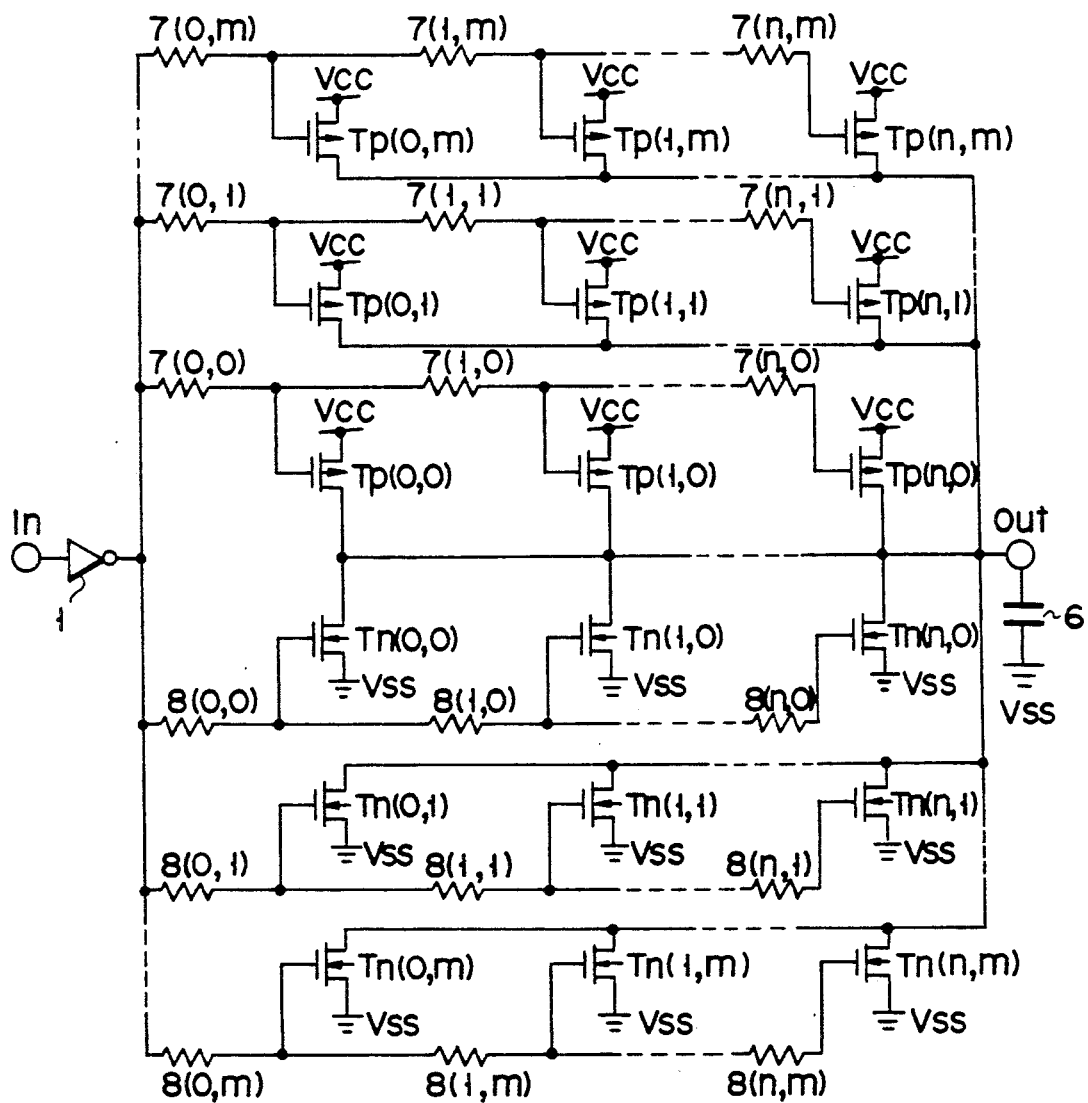
F I G. 8

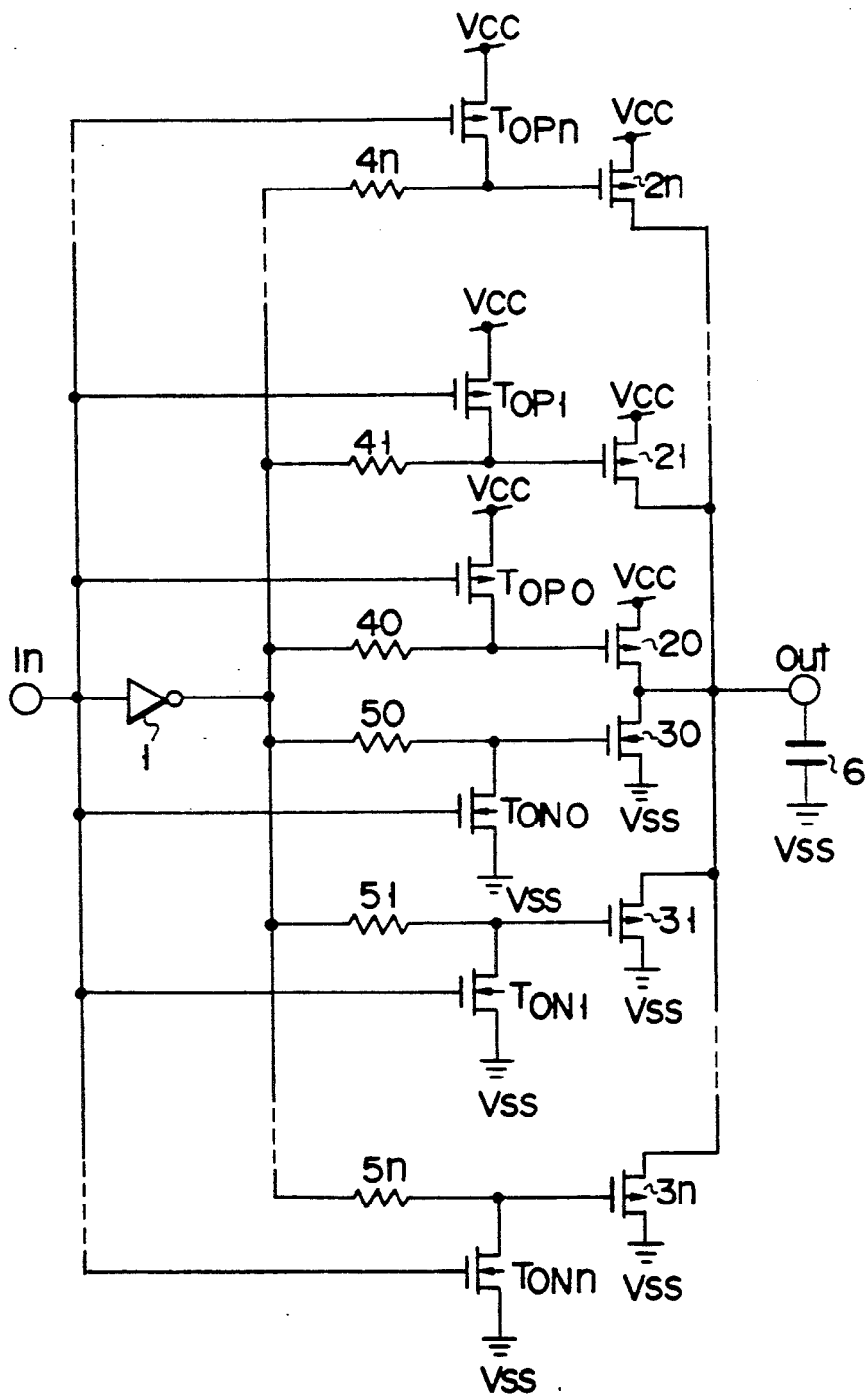
F I G. 10

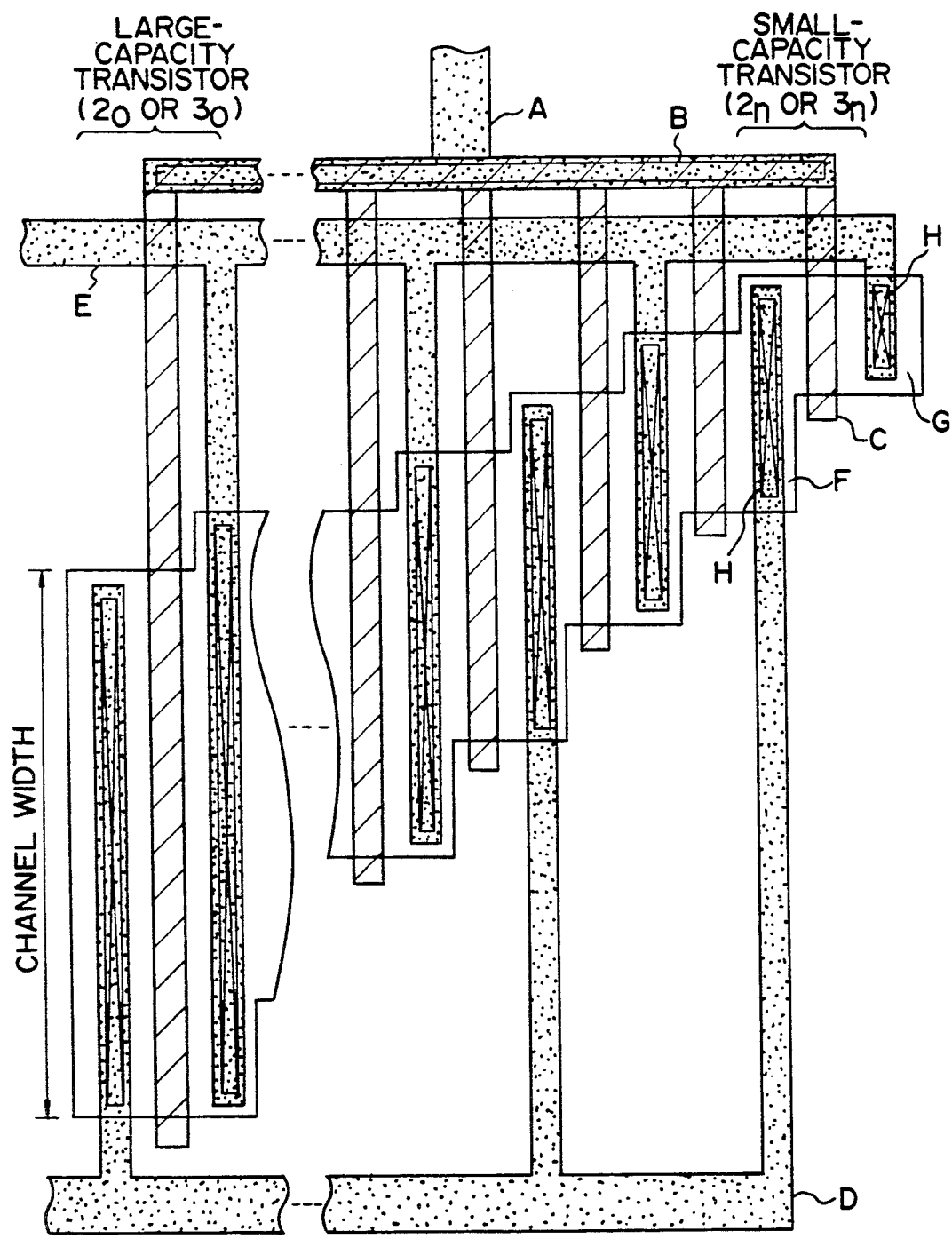
F I G. 12

OUTPUT CIRCUIT OF SEMICONDUCTOR INTEGRATED CIRCUIT WITH REDUCED POWER SOURCE LINE NOISE

BACKGROUND OF THE INVENTION

1. Field of the Invention

This invention relates to an output circuit of a semiconductor integrated circuit, and more particularly to the improvement for reduction in the power source noise occurring when a plurality of output circuits perform switching operations at the same time.

2. Description of the Related Art

It is well known in the art that resistive, capacitive and inductive loads are parasitically associated with the power source line of a semiconductor integrated circuit (IC). Among these parasitic loads, the inductive load in particular causes a large noise level when current flowing via the power source line changes abruptly. Such an abrupt change of current is caused by an output circuit for outputting a signal to the exterior of the IC. That is, it is necessary for the output circuit to extract a sufficiently large current from the power source line and charge or discharge a load capacitor outside the IC so as to drive the load capacitor at high speed. In general, a plurality of output circuits of the same type as described above are used in the IC, and some of them perform switching operations at the same time.

FIG. 6 is a circuit diagram showing the construction of the prior art output circuit provided in the MOS IC. Input signal In in the IC is supplied to buffer 24 having a CMOS inverter constituted by P-channel MOS transistor 22 and N-channel MOS transistor 23 via pre-buffer 21 constituted by an inverter. Output signal Out is output from the output terminal of buffer 24.

In the above output circuit, buffer 24 is formed of one P-channel MOS transistor and one N-channel MOS transistor. Therefore, the current flowing out from power source voltage terminal Vcc and current flowing into ground voltage terminal Vss when output signal Out is changed are determined by the characteristics of the above transistors.

Recently, with increases in the output currents and operation speeds of ICs, it has become necessary to increase the mutual conductance of the output circuit in order to enhance the current driving ability for the load. To meet this requirement, the ON-resistances of transistors 22 and 23 constituting buffer 24 tend to be reduced.

As a result, the possibility of noise occurring in the power source lines for the power source voltage and ground voltage becomes larger, and the possibility of noise being mixed into the signal of the output circuit which does not perform the switching operation also increases.

Conventionally, the buffer of the output circuit is constituted by transistors having a large current driving ability, and the transistor is operated at a high switching speed. As a result, the noise occurring in the power source line increases even further, thereby causing the introduction of more noise into the signal of the output circuit.

SUMMARY OF THE INVENTION

This invention has been made in consideration of the above situation, and an object of this invention is to provide an output circuit of a semiconductor integrated circuit capable of reducing the noise occurring in the power source lines at the time of a switching operation.

The output circuit of the semiconductor integrated circuit of this invention includes a plurality of output transistors having different current driving abilities for a load; and a plurality of signal delay means for delaying signals for driving the respective output transistors by different delay times, wherein the plurality of output transistors ar sequentially driven by outputs of the plurality of signal delay means whose signal delay times are set to be longer for the output transistors having larger load current driving abilities.

The plurality of output transistors having different current driving abilities are sequentially driven with time delays. In this case, an output transistor having a larger current driving ability is driven with a longer delay time. As a result, variation in the current flowing in the power source line with time can be made small and constant. Therefore, the switching noise can be suppressed.

BRIEF DESCRIPTION OF THE DRAWINGS

FIGS. 2A to 2C show characteristics of the embodiment in FIG. 1;

FIG. 3 illustrates a comparison between the output waveform obtained by the circuit of FIG. 1 and that by the circuit of FIG. 6;

FIG. 4 is a circuit diagram showing the construction of another embodiment of this invention;

FIG. 5 is a circuit diagram showing the construction of still another embodiment of this invention;

FIG. 6 is a circuit diagram showing the construction of an output circuit of the conventional semiconductor integrated circuit;

FIG. 8 is a circuit diagram showing the construction of another embodiment of this invention which is constituted by connecting a plurality of circuits shown in FIG. 4 in parallel;

FIG. 10 is a circuit diagram showing the construction of another embodiment of this invention including another circuit construction for preventing penetration currents from flowing between power source terminals Vcc and Vss;

FIG. 12 shows an IC pattern in which buffer MOS transistors are connected in parallel as in the case of FIG. 1.

DETAILED DESCRIPTION OF THE PREFERRED EMBODIMENTS

There will now be described an embodiment of this invention with reference to the accompanying drawings.

Figure 1:
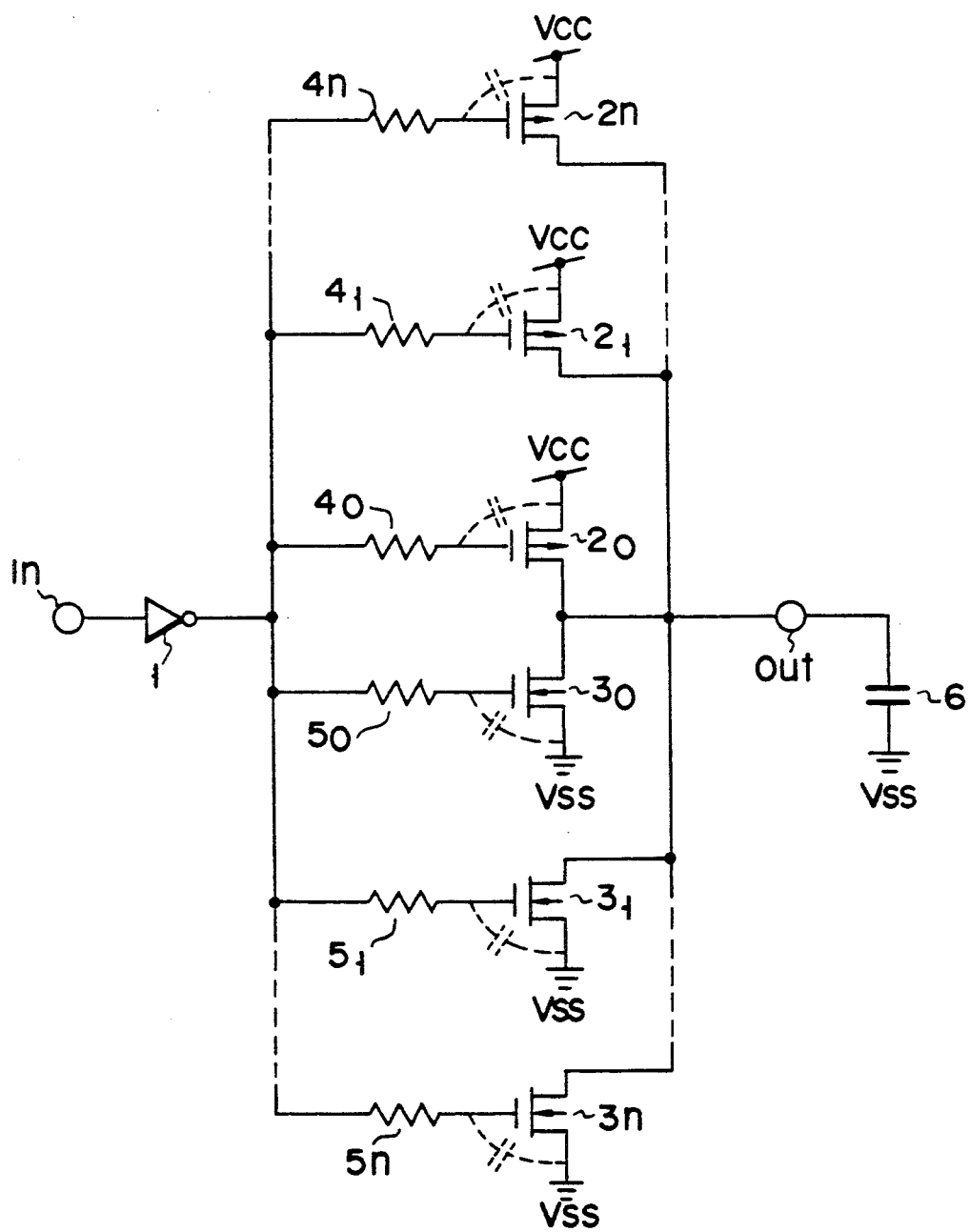
FIG. 1 is a circuit diagram showing the construction of one embodiment of this invention.

FIG. 1 is a circuit diagram showing the construction of one embodiment of this invention applied to the output circuit of a MOS IC. In FIG. 1, 1 denotes a pre-buffer constituted by an inverter supplied with signal In in the IC. $2_0$ to $2n$ denote output transistors of the P-channel section respectively constituting buffers for amplifying the output of pre-buffer 1 and outputting the amplified output as signal Out to the exterior of the IC. $3_0$ to $3n$ denote output transistors of the N-channel section respectively constituting buffers.

The sources of (n+1) output transistors $2_0$ to $2n$ of the P-channel section are connected to power source potential terminal Vcc, and the drains thereof are commonly connected to a connection node for output signal Out. In this case, among output transistors $2_0$ to $2n$, transistor $2_0$ has the largest current driving ability, and the current driving abilities of output transistors $2_0$ to $2n$ become smaller respectively. The sources of (n+1) output transistors $3_0$ to $3n$ of the N-channel section are connected to ground potential terminals Vss and the drains thereof are commonly connected to a node for output signal Out. Like the output transistors of the P-channel section, among (n+1) output transistors $3_0$ to $3n$ of the N-channel section, transistor $3_0$ has the largest current driving ability, and the current driving abilities of output transistors $3_0$ to $3n$ become smaller respectively. Further, the entire current driving ability of output transistors $2_0$ to $2n$ of the P-channel section is set equal to the current driving ability of one P-channel MOS transistor in the buffer of a conventional output circuit. Likewise, the entire current driving ability of output transistors $3_0$ to $3n$ of the N-channel section is set equal to the current driving ability of one N-channel MOS transistor in the buffer of a conventional output circuit.

(n+1) resistors $4_0$ to $4n$ which are formed of polysilicon, for example, are respectively connected between the output terminal of pre-buffer 1 and each of the gates of (n+1) output transistors $2_0$ to $2n$ of the P-channel section. Likewise, (n+1) resistors $5_0$ to $5n$ which are formed of polysilicon, for example, are respectively connected between the output terminal of pre-buffer 1 and each of the gates of (n+1) output transistors $3_0$ to $3n$ of the N-channel section. As seen in FIG. 1, resistors $4_0$ and $5_0$, for example, are disposed in parallel with resistors $4_1$ and $5_1$ and therefore collectively constitute a parallel circuit. Among (n+1) resistors $4_0$ to $4n$, resistor $4n$ has the smallest resistance, and the resistances of resistors $4n$ to $4_0$ become larger respectively. Likewise, among (n+1) resistors $5_0$ to $5n$, resistor $5n$ has the smallest resistance, and the resistances of resistors $5n$ to $5_0$ become larger respectively. Assuming that the resistances of resistors $4_0$ to $4n$ and $5_0$ to $5n$ are $rP_0$ to $rPn$ and $rN_0$ to $rNn$, the following relation is obtained:

$$rPi < rP(i-1) \ (i = 1, \ldots, n) \quad (1)$$

$$rNi < rN(i-1) \ (i = 1, \ldots, n) \quad (2)$$

Resistors 4 and 5 are respectively combined with gate input capacitors parasitically associated with the gates of respective P-channel MOS transistors 2 and N-channel MOS transistors 3 to constitute signal delay circuits.

The signal delay circuits have CR time constants determined by the resistances of respective resistors 4 and 5 and capacitances of the respective gate input capacitors. That is, the signal delay times of the delay circuits are set in proportion to the resistances of the respective resistors 4 and 5. More specifically, the signal delay times associated with resistors $4_0$ to $4n$ in the P-channel section become progressively shorter, and the signal delay times associated with resistors $5_0$ to $5n$ in the N-channel section become progressively shorter.

As described above, in the circuit of this embodiment, the output transistors in the P-channel and N-channel sections of the buffer are selectively driven with the signal delay times thereof being set to be longer for the output transistors having larger load current driving abilities. Capacitor 6 connected between a node for output signal Out and ground voltage terminal Vss shows an equivalent element of the external load driven by means of the output circuit.

The operation of the output circuit of the above construction will now be explained. First, assume that transistors 3 on the N-channel section are turned on and output signal Out is changed from voltage level Vcc to voltage level Vss as shown in FIG. 2A. Output signal Out is changed from Vcc to Vss when input signal In has been changed from Vcc to Vss. When the output of pre-buffer 1 is changed from Vss to Vcc, the output of a signal delay circuit constituted by resistor $5n$ and the gate input capacitor of N-channel MOS transistor $3n$ connected to resistor $5n$ and having the shortest delay time is first to be changed from Vss to Vcc. As a result, transistor $3n$ having the smallest current driving ability in the N-channel section is first turned on, thereby permitting output signal Out to be discharged towards ground voltage Vss via transistor $3n$. At this time, since the current driving ability of transistor $3n$ is small, the current flowing into the power source line of ground voltage Vss will not change abruptly. Similarly, the outputs of the signal delay circuits are sequentially changed from Vss to Vcc in the order from the delay circuit having a shorter delay time to the delay circuit having a longer delay time. In this way, transistors 3 are sequentially turned on in the order from the transistor having a smaller current driving ability to the transistor having a larger current driving ability. Therefore, variation in current flowing into the power source line of ground voltage Vss with time can be suppressed to a minimum and kept constant.

FIG. 2B is a waveform diagram showing variations in the output currents in the conventional circuit and the circuit of the above embodiment, which are respectively indicated by broken and solid lines. FIG. 2C is a waveform diagram showing variations in the noise occurring in the power source lines when the above output currents flow in the conventional circuit and the circuit of the above embodiment, which are respectively indicated by broken and solid lines. As shown in FIG. 2C, the occurrence of power source noise in the circuit of the above embodiment is significantly reduced in comparison with the conventional case which is indicated by the broken line.

In contrast, when output signal Out is changed from Vcc level to Vss level, voltage Vout is expressed as follows:

$$V_{out}(t) = V_{cc} - \frac{1}{C6} \int I(t)dt \qquad (3)$$

where C6 is the capacitance of load capacitor 6 and I(t) is a current flowing into the ground terminal.

In order to suppress the noise caused by output signal Out to a minimum and enhance the switching operation speed, it is necessary to set the condition that $di/dt = K$ (K is a constant), that is, $I(t) = Kt$. In the circuit of the above embodiment, as shown by the waveform diagram indicated by the solid line in FIG. 2B, the rate of an increase in the current can be substantially expressed by a linear function of time t, that is, the current increases linearly with time t, and therefore the above condition can be satisfied. At this time, the following equation can be obtained:

$$V_{out}(t) = V_{cc} - \frac{K}{2 \cdot C6} t^2 \qquad (4)$$

Thus, as shown by the solid line characteristic curve in FIG. 3, variation in output voltage Vout with time t can be expressed by a quadric curve. In FIG. 3, the broken line characteristic shows variation in the output voltage in the conventional circuit. As is clearly seen from FIG. 3, the output noise can be suppressed to a minimum when the value of $d2V/dt2$ is constant. The resistances of resistors 4 and 5 are set so as to obtain such a characteristic curve.

In the circuit of the above embodiment, when transistor 2 of the P-channel section is turned on and output signal Out is switched from Vss to Vcc, noise occurs in the power source line of power source voltage Vcc. Also, in this case, the noise occurring in the power source line of Vcc can be suppressed for the same reason as described above.

As described above, according to the circuit of this embodiment, a plurality of output transistors are provided in each of the P-channel and N-channel sections of the buffer. Since the output transistors are sequentially turned on with respective time delays, noise occurring in the power source line can be significantly suppressed. Further, since the load current driving abilities of the output transistors of the P-channel and N-channel sections can be set at the same values as in the conventional case, high operation speeds and a high output circuit can be maintained. Since the power source noise can be suppressed, output noise in the output circuits which do not perform the switching operation can also be suppressed.

FIG. 4 is a circuit diagram showing the construction of another embodiment of this invention which is applied to the output circuit of a MOS IC. In the circuit of the embodiment shown in FIG. 1, resistors 4 and 5 which are combined with the respective gate input capacitors of output transistors 2 and 3 to constitute the signal delay circuits with respective CR time constants are connected between the output terminal of pre-buffer 1 and the gates of output transistors 2 and 3, respectively. However, in the circuit of the embodiment of FIG. 4, (n+1) resistors $7_0$ to $7_n$ are series-connected between the output terminal of pre-buffer 1 and the gate of transistor $2_0$ included in (n+1) output transistors $2_0$ to $2_n$ of the P-channel section and having the largest current driving ability. Further, (n+1) resistors $8_0$ to $8_n$ are series-connected between the output terminal of pre-buffer 1 and the gate of transistor $3_0$ included in (n+1) output transistors $3_0$ to $3_n$ of the P-channel section and having the largest current driving ability. In this case, delay signals derived from nodes of (n+1) resistors $7_0$ to $7_n$ of the P-channel section and respectively having gradually increasing delay times are sequentially supplied to the gates of output transistors $2_n$ to $2_1$ (in FIG. 4, transistor $2_1$ is not shown). Likewise, delay signals derived from nodes of (n+1) resistors $8_0$ to $8_n$ of the N-channel section and having gradually increasing delay times are sequentially supplied to the gates of output transistors $3_n$ to $3_1$ (in FIG. 4, transistor $3_1$ is not shown).

When the driving abilities of the output transistors are adjusted as described above, variation in the current flowing in the power source line with time can be suppressed. In the case of this embodiment, it is not always necessary to set the resistances of resistors $7_0$ to $7_n$ at different values. Similarly, it is not always necessary to set the resistances of resistors $8_0$ to $8_n$ at different values.

FIG. 5 is a circuit diagram showing the construction of still another embodiment of this invention which is applied to the output circuit of a MOS IC. In the circuit of the embodiment of FIG. 1, the output of the pre-buffer is delayed by mean of the signal delay circuits each constituted by the resistor and the gate input capacitor of the MOS transistor. However, in the circuit of the embodiment of FIG. 5, the output terminals of pre-buffers $10_0$ to $10_n$ are respectively connected to CMOS inverters $9_0$ to $9_n$ which respectively include MOS transistors $2_0$ to $2_n$ of the P-channel section and MOS transistors $3_0$ to $3_n$ of the N-channel MOS transistors to constitute buffers. In this case, the current driving ability or circuit threshold voltage of each of pre-buffers $10_0$ to $10_n$ is determined according to the load current driving abilities of the MOS transistors constituting a corresponding one of CMOS inverters $9_0$ to $9_n$. For example, when it is required to change the current driving ability of pre-buffer 10, the signal delay time is determined according to the current driving ability thereof and the input capacitor of CMOS inverter 9 of the succeeding stage. Further, when it is required to change the circuit threshold voltage of pre-buffer 10, the signal delay time is determined according to the threshold voltage thereof.

Figure 7:
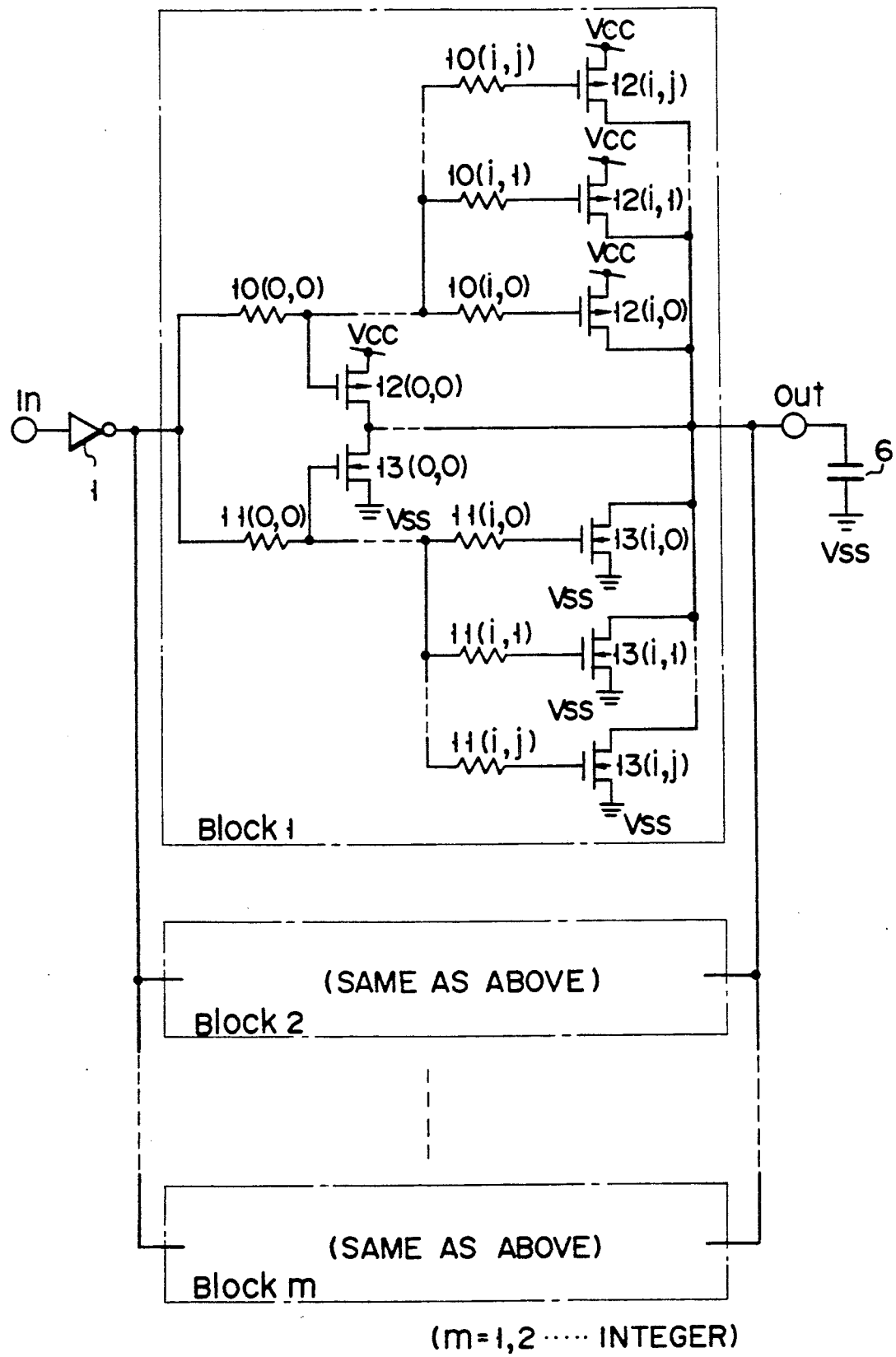
FIG. 7 is a circuit diagram showing the construction of still another embodiment of this invention including a plurality of circuit blocks in which part of the circuit shown in FIG. 4 is replaced by the circuit shown in FIG. 1.

FIG. 7 is a circuit diagram showing the construction of a transistor circuit according to still another embodiment of this invention and including a plurality of circuit blocks 1 to m in which part of the circuit shown in FIG. 4 is replaced by the circuit shown in FIG. 1.

In circuit block 1, each of the connection nodes between series-connected resistors 10(0,0) to 10(i,0) is connected to a corresponding one of the gates of P-channel MOS transistors 12(0,0) to 12(i,0) in the same manner as in FIG. 4. Likewise, each of the connection nodes between series-connected resistors 11(0,0) to 11(1,0) is connected to a corresponding one of the gates of N-channel MOS transistors 13(0,0) to 13(i,0).

Subscripts i and j are integers which can be selectively set. That is, the gate of P-channel MOS transistor 12(i,0) is connected to freely selected connection node (i-1) of series-connected resistors 10(0,0) to 10(i,0) via resistor 10(i,0), and the gate of N-channel MOS transistor 13(i,0) is connected to freely selected connection node (i-1) of series-connected resistors 11(0,0) to 11(i,0) via resistor 11(i,0).

P-channel MOS transistors 12(i,l) to 12(i,j), whose gates are respectively series-connected to resistors 10(i,1) to 10(i,j), are connected in parallel to the gate of P-channel MOS transistor 12(i,0), whose gate is series-connected to resistor 10(i,0), and an optional connection node. Likewise, N-channel MOS transistors 13(i,l) to 13(i,j), whose gates are respectively series-connected to resistors 11(i,l) to 11(i,j), are connected in parallel to the gate of N-channel MOS transistor 13(i,0), whose gate is series-connected to resistor 11(i,0), and an optional node. Thus, as seen in FIG. 7, resistors 10(i,0) and 11(i,0), for example, are series-parallel connected to resistors 10(0,0), 11(0,0), 10(i,j), and 11(i,j). Each of the drains of P-channel MOS transistors 12(0,0) to 12(i,j) and each of the drains of N-channel MOS transistors 13(0,0) to 13(i,j) are commonly connected to output terminal Out.

The relation between the resistances of resistors 10(0,0) to 10(i,0) and resistors 11(0,0) to 11(i,0) is determined in the same manner as in the case of the relation between the resistances of resistors $7_0$ to $7n$ and resistors $8_0$ to $8n$ of FIG. 4. Further, the relation between the resistances of resistors 10(i,0) to 10(i,j) and resistors 11(i,0) to 11(i,j) is determined in the same manner as in the case of the relation between the resistances of resistors $4_0$ to $4n$ and resistors $5_0$ to $5n$ of FIG. 1.

In the embodiment of FIG. 7, block 1 and blocks 2 to m having the same circuit construction as block 1 are connected in parallel (subscript numerals i and j may be differently set in each of blocks 1 to m).

FIG. 8 is a circuit diagram showing the construction of a transistor circuit according to another embodiment of this invention and corresponding to a circuit which is obtained by connecting a plurality of circuits shown in FIG. 4 in parallel.

In this case, resistors 7(0,0) to 7(n,m) and resistors 8(0,0) to 8(n,m) are used to set the load driving abilities and load driving starting phases of the parallel-connected MOS transistors to different values, and it is not necessary to set the resistances of the resistors connected to the transistors on the same row in FIG. 8 to the same value.

For example, when the driving abilities of the P-channel MOS transistors are set such that Tp(0,0) < Tp(0,1) < . . . < Tp(0,m) < Tp(1,0) < Tp(1,1) < . . . < Tp(1,m) < . . . < Tp(n,0) < Tp(n,1) < . . . < Tp(n,m), the output signal phase of pre-buffer 1 can be set so as to become larger in the order of Tp(0,0), Tp(0,1), . . . Tp(0,m), Tp(1,0), Tp(1,1), . . . Tp(1,m), Tp(n,0), Tp(n,1), . . . and Tp(n,m) by adequately setting the resistances of the gate resistors of the P-channel MOS transistors.

Further, it is not necessary to use the same number of transistors to constitute each transistor group on the same row in FIG. 8.

Figure 9:
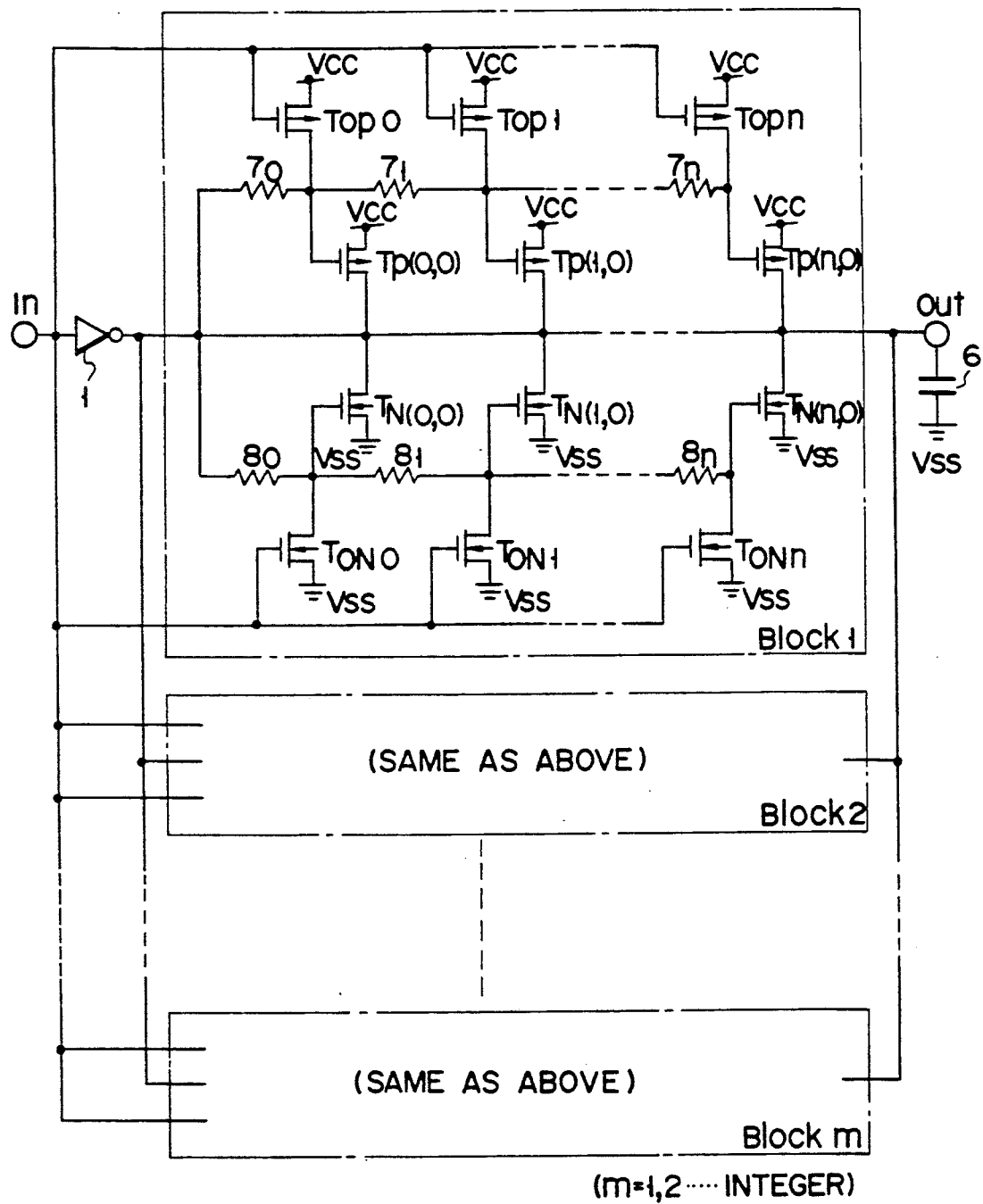
FIG. 9 is a circuit diagram showing the construction of still another embodiment of this invention including a plurality of circuit blocks for preventing penetration currents from flowing between power source terminals Vcc and Vss.

FIG. 9 is a circuit diagram showing the construction of still another embodiment of this invention including a plurality of circuit blocks for preventing penetration currents from flowing between power source terminals Vcc and Vss.

In a case where the output signal of pre-buffer 1 is set to have different phases, the output signal of the pre-buffer for turning off the transistor which is driven by a signal with phase lag is set to have a corresponding phase lag. In this condition, when pre-buffer 1 is switched from one state to the other, the P-channel MOS transistor and N-channel MO transistor are simultaneously kept on for a longer period of time. In the period of time in which both the transistors are kept conductive, a penetration current will flow between power source terminals Vcc and Vss.

In the embodiment of FIG. 9, P-channel MOS transistors T0P0 to T0Pn, causing no phase delay (that is, having no delay resistor connected to the gate thereof) which results in occurrence of the simultaneous on-state, are inserted between each gate of P-channel MOS buffer transistors TP(0,0) to TP(n,0) and power source terminal Vcc, and N-channel MOS transistors T0N0 to T0Nn having no delay resistor connected to the gate thereof are inserted between each gate of N-channel MOS buffer transistors TN(0,0) to TN(n,0) and power source terminal Vss.

The gates of P-channel MOS transistors T0P0 to T0Pn and N-channel MOS transistors T0N0 to T0Nn are driven by the input signal of pre-buffer 1 without phase lag. The gates of transistors TP(0,0) to TP(n,0) and TN(0,0) to TN(n,0) are simultaneously driven by means of the transistors which are driven without phase lag, thereby preventing the penetration current flow.

The circuit of FIG. 9 corresponds to a circuit obtained by adding the penetration current preventing circuit to the circuit of FIG. 4.

FIG. 10 is a circuit diagram showing the construction of another embodiment of this invention including another circuit construction for preventing penetration currents from flowing between power source terminals Vcc and Vss.

The circuit of FIG. 10 corresponds to a circuit obtained by applying the penetration current preventing transistors (T0P0 to T0Pn, T0N0 to T0Nn) to the parallel buffer transistors ($2_0$ to $2n$, $3_0$ to $3n$).

Figure 11:
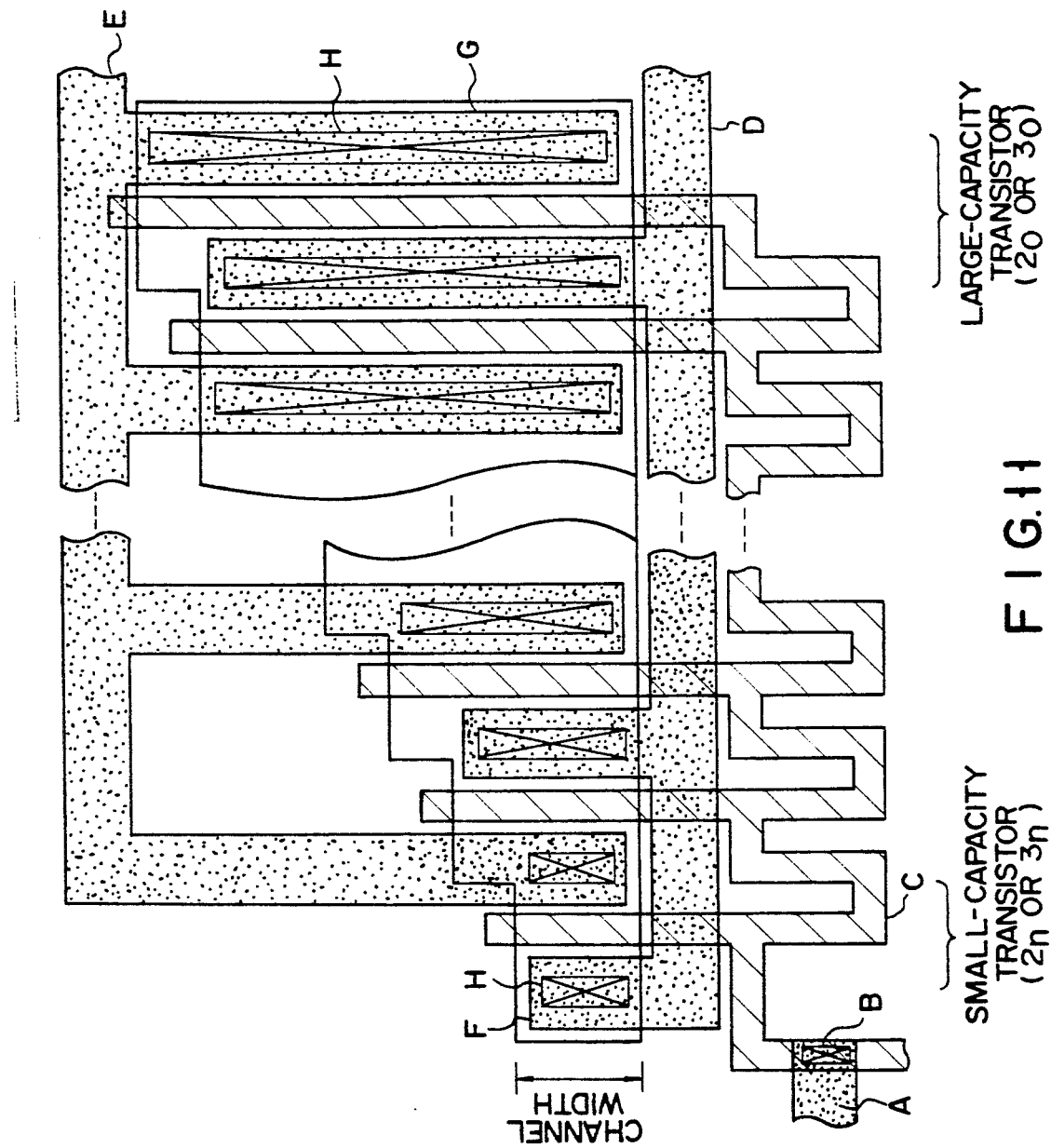
FIG. 11 shows an IC pattern in which buffer MOS transistors are series-connected as in the case of FIG. 4.

FIG. 11 shows an IC pattern in which buffer MOS transistors ($2_0$ to $2n$, $3_0$ to $3n$) are series-connected as in the case of FIG. 4. In FIG. 11, symbol A denotes output metal of pre-buffer 1, symbol B denotes a metal-polysilicon contact hole, symbol C denotes a polysilicon layer, symbol D denotes source metal, symbol E denotes drain metal, symbol F denotes a source diffusion area, symbol G denotes a drain diffusion area and symbol H denotes a diffusion-metal contact hole. Polysilicon layer C is used for formation of a gate delay resistor.

In FIG. 11, the channel width of a transistor section driven by a signal with relatively leading phase is narrow, and the channel width of a transistor section driven by a driving signal with larger phase lag is set wider (the transistor section having a wider channel width has a larger driving ability).

FIG. 12 shows an IC pattern in which buffer MOS transistors are connected in parallel as in the case of FIG. 1. In this case, the channel width of a transistor in which a distance from contact hole B for pre-buffer output signal metal wiring A and gate polysilicon layer C to diffusion areas F and G is short (that is, the gate resistance is small) is set small, and the channel width of a transistor in which a distance from contact hole B to diffusion areas F and G is long (that is, the gate resistance is large) is set large.

Figure 13:
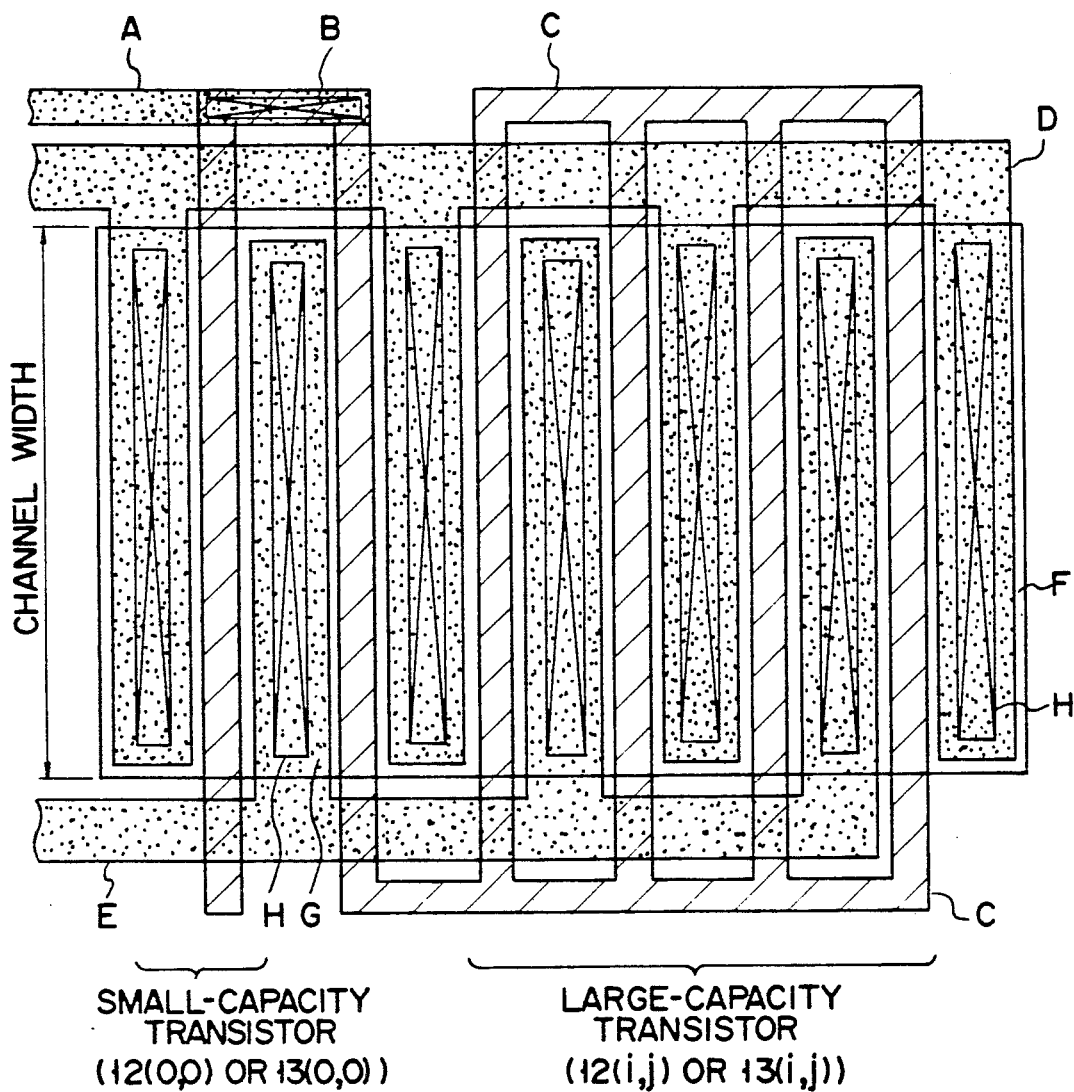
FIG. 13 shows an IC pattern in which buffer MOS transistors are connected in a series-parallel fashion as in the case of FIG. 7.

FIG. 13 shows an IC pattern in which buffer MOS transistors are connected in a series-parallel fashion as in the case of FIG. 7. In this example, a parasitic resistance component formed in the gate wiring portion when the gate of the transistor is formed by use of polysilicon layer C is used as a gate delay resistor.

In the examples of FIGS. 11 and 12, the driving abilities of the transistors are adjusted by the channel widths of the MOS transistors. However, the driving ability of the transistor can also be adjusted by changing the channel length, the gate oxide film thickness, or the threshold voltage of the transistor.

As described above, according to this invention, a semiconductor integrated circuit can be provided which can suppress noise occurring in the power source line at the time of a switching operation.

What is claimed is:

1. An output circuit of a semiconductor integrated circuit comprising:
   a plurality of output transistors connected in common to a load and having different current driving abilities for said load; and
   a plurality of signal delay means with outputs thereof each connected respectively to inputs of said plurality of output transistors for delaying driving signals for driving each of said output transistors by different delay time;
   wherein the current driving ability of at least a first one of said plurality of output transistors, which is driven by the delay signal of one of said signal delay means which has first delay time, is set to be larger than the current driving ability of at least a second one of said plurality of output transistors, which is driven by the delay signal of one of said signal delay means which has a second delay time shorter than the first delay time.

2. An output of a semiconductor integrated circuit according to claim 1, wherein said plurality of output transistors are sequentially driven by the outputs of said signal delay means such that drive signals supplied to ones of said plurality of output transistors having a greater current driving ability are delayed longer than drive signals applied to ones of said plurality of output transistors having a smaller current carrying ability, thereby causing the output transistors having a greater current driving ability to be driven after the output transistors having a smaller current driving ability.

3. An output of a semiconductor integrated circuit according to claim 1, wherein each of said delay means is constituted by a time constant circuit formed of a resistor element of polysilicon and an input capacitor of a corresponding one of said output transistors.

4. A transistor circuit comprising:
   pre-buffer means for supplying a pre-buffer output corresponding to an input signal;
   first buffer means connected to said prebuffer means for supplying an output corresponding to the pre-buffer output to a preset load;
   second buffer means connected to said first buffer means for supplying an output corresponding to the pre-buffer output of said preset load, said second buffer means having a larger load driving ability than said first buffer means;
   first delay means connected in series between said pre-buffer means and said first buffer means, for delaying the pre-buffer output by a first preset delay time; and p1 second delay means connected in series between said pre-buffer means and said second buffer means, for delaying the pre-buffer output by a second preset delay time, said second preset delay time being set longer than said first preset delay time.

5. A transistor circuit according to claim 4, wherein said first delay means includes a first resistor, said second delay means includes a second resistor and, said first resistor being connected in series with said second resistor.

6. A transistor circuit according to claim 4, wherein said first and second delay means constitute a parallel circuit.

7. A transistor circuit according to claim 4, wherein said first delay means includes a first resistor means for providing a first resistance, said second delay means includes a second resistor means for providing a second resistance, and a third resistor means, such that said first resistor means is electrically connected to said second resistor means and said third resistor means, said second resistor means and said second node of said third resistor means each being electrically connected to said second buffer means.

8. A transistor circuit comprising:
   inverter means for supplying a pre-buffer output corresponding to an inverted signal of an input signal;
   first buffer means connected to said inverter means for supplying an output corresponding to the pre-buffer output to a preset load;
   second buffer means connected to said first buffer means for supplying an output corresponding to the pre-buffer output to said preset load, said second buffer means having a larger load driving ability than said first buffer means;
   delay means connected between said inverter means and said second buffer means, for delaying the pre-buffer output by a preset delay time; and
   supply means for supplying, with a predetermined small time delay, a given signal corresponding to the input signal to said first buffer means.

9. An output circuit of a semiconductor integrated circuit, comprising:
   a plurality of output transistors, each having an output node connected to a load of the output circuit and an input node connected to receive an input signal of the output circuit, each of said output transistors having different current driving abilities for the load, wherein the current driving ability of one of said output transistors is greater than that of another one of said output transistors; and
   delay means with plural outputs thereof for delaying the input signal by a plurality of delay times and for supplying signals, corresponding to the delayed input signals, connected to the respective input nodes of said output transistors, wherein the delay time of said one of the output transistors is longer than that of said another one of the output transistors.

* * * * *

UNITED STATES PATENT AND TRADEMARK OFFICE
CERTIFICATE OF CORRECTION

PATENT NO. : 5,128,567
DATED : July 07, 1992
INVENTOR(S) : Fuminari Tanaka et al It is certified that error appears in the above-identified patent and that said Letters Patent is hereby corrected as shown below:

Claim 1, column 9, line 15, change "time" to --times--.

Claim 1, column 9, line 19, after "has" insert --a--.

Claim 4, column 9, line 44, change "prebuffer" to --pre-buffer--.

Claim 4, column 9, line 55, delete "pl" and begin a new paragraph at "second".

Claim 7, column 10, line 19, delete "said second node of".

Signed and Sealed this

Nineteenth Day of October, 1993

Attest:

BRUCE LEHMAN

Attesting Officer      Commissioner of Patents and Trademarks